United States Patent [19]

Tokushige

[11] Patent Number: 4,879,692
[45] Date of Patent: Nov. 7, 1989

[54] DYNAMIC MEMORY CIRCUIT WITH IMPROVED SENSING SCHEME

[75] Inventor: Kazuo Tokushige, Tokyo, Japan

[73] Assignee: NEC Corporation, Tokyo, Japan

[21] Appl. No.: 202,847

[22] Filed: Jun. 6, 1988

[30] Foreign Application Priority Data

Jun. 4, 1987 [JP] Japan .................................. 62-140811

[51] Int. Cl.[4] .......................... G11C 8/00; G11C 7/00
[52] U.S. Cl. ................................ 365/230.03; 365/205;
365/222; 365/189.01; 365/230.08
[58] Field of Search ............... 365/205, 222, 189, 233,
365/189.05, 189.01, 189.11, 230.03, 230.06,
230.08

[56] References Cited

U.S. PATENT DOCUMENTS

| | | | |
|---|---|---|---|
| 4,494,222 | 1/1985 | White et al. | 365/222 |
| 4,680,737 | 7/1987 | Oishi et al. | 365/189 |
| 4,758,987 | 7/1988 | Sakui | 365/189 |
| 4,764,901 | 8/1988 | Sakurai | 365/222 |
| 4,771,406 | 9/1988 | Oishi et al. | 365/222 |
| 4,796,234 | 1/1989 | Itoh et al. | 365/189.05 |
| 4,802,134 | 1/1989 | Tsujimoto | 365/189.05 |

Primary Examiner—Stuart N. Hecker
Assistant Examiner—Melissa J. Koval
Attorney, Agent, or Firm—Sughrue, Mion, Zinn, Macpeak & Seas

[57] ABSTRACT

A dynamic type memory circuit is provided with an improved write circuit which can write a desired data signal to a memory cell in a selected column in a first mode and to a plurality of memory cells in all the columns simultaneously in a second mode. The memory circuit includes a plurality of memory cell groups, a plurality of sense amplifier groups provided for the memory cell groups, a write circuit for operatively writing an input data signal to a plurality of memory cells simultaneously in at least one memory cell groups and a plurality of independent sense amplifier activation circuits provided for the sense amplifier groups.

4 Claims, 3 Drawing Sheets

DYNAMIC MEMORY CIRCUIT WITH IMPROVED SENSING SCHEME

BACKGROUND OF THE INVENTION

The present invention relates to a dynamic memory circuit, and more particularly to a dynamic type semiconductor memory circuit employing flip-flop type sense amplifiers.

Dynamic memories are widely utilized in various fields as large capacity memories. A dynamic memory generally comprises a large number of memory cells in a matrix form of rows and columns, word lines in rows and digit lines in columns. In reading or refreshing operation, memory cells coupled to the selected word line cause small potential changes in the digit lines. Such small potential changes in the digit lines or digit line pairs are amplified by sense amplifiers ad the amplified signals are rewritten into the memory cells coupled to the selected word line. In writing operation, a write data signal is applied via the selected digit .line or digit line pair to the selected memory cell while the sense amplifier coupled to the selected digit line or digit line pair is enabled. The sense amplifier is generally comprised of a flip-flop type differential amplifier and the digit line of a lower potential in the digit line pair is discharged through the sense amplifier to a sense amplifier activation signal line in response to the change from a high level corresponding to a precharge level of the digit line to a low level in that line. Thus, the digit line of the lower potential becomes at the minimum level such as the ground potential thereby to achieve amplification or refresh of the read out signal of the selected memory cell.

Recently, there has been proposed a memory in which columns are classified into a plurality of column blocks with the common rows and each column block is provided with a read-write circuit. In such memory, writing of data into one column block and refreshing of contents of memory cells of other column blocks are simultaneously performed. In the above operation, a relatively large signal is applied to the column block performing a write operation and therefore the state of the sense amplifier or amplifiers in the above column block are determined rapidly. While, small signals are produced on digit lines from the memory cells in other column blocks performing refresh operation. Therefore, sense amplifiers in the above other column blocks are required to discharge the lower potential of digit lines gradually to the sense amplifier activation signal line.

However, the rapidly established states of the sense amplifiers in the column block performing write operation adversely affect the sense amplifier activation signal line to change the potential at that line to the low level in an unexpectedly short period of time Therefore, the sense amplifiers in the above other column blocks fail to accurately amplifying small read-out signals on the digit line, resulting in insufficient or erroneous refresh operation.

SUMMARY OF THE INVENTION

It is an object of the present invention to provide an improved dynamic memory circuit in which both refresh operation and write operation can be simultaneously conducted stably without failure of refresh operation.

The memory circuit according to the present invention comprises a plurality of memory cell groups, a plurality of sense amplifier groups provided for the memory cell groups, a write circuit for writing data to at least one of the memory cell groups, means for achieving refresh operation with respect to the remaining memory cell group or groups, and a plurality of sense amplifier activation means separately provided for the respective sense amplifier groups.

According to the present invention, each sense amplifier group associated to each memory cell group is provided with its own sense amplifier activation means. A plurality of sense amplifier activation means are provided separately and independently. Therefore, one associated to the memory cell group subjected to write operation is isolated from the other sense amplifier activation means associated to the memory cell group or groups subjected to-refresh operation. The sense amplifiers of the sense amplifier group in the writing condition and the sense amplifiers of the sense amplifier groups in the refreshing condition can operate separately without affecting each other.

DETAILED DESCRIPTION OF THE INVENTION

Figure 1:
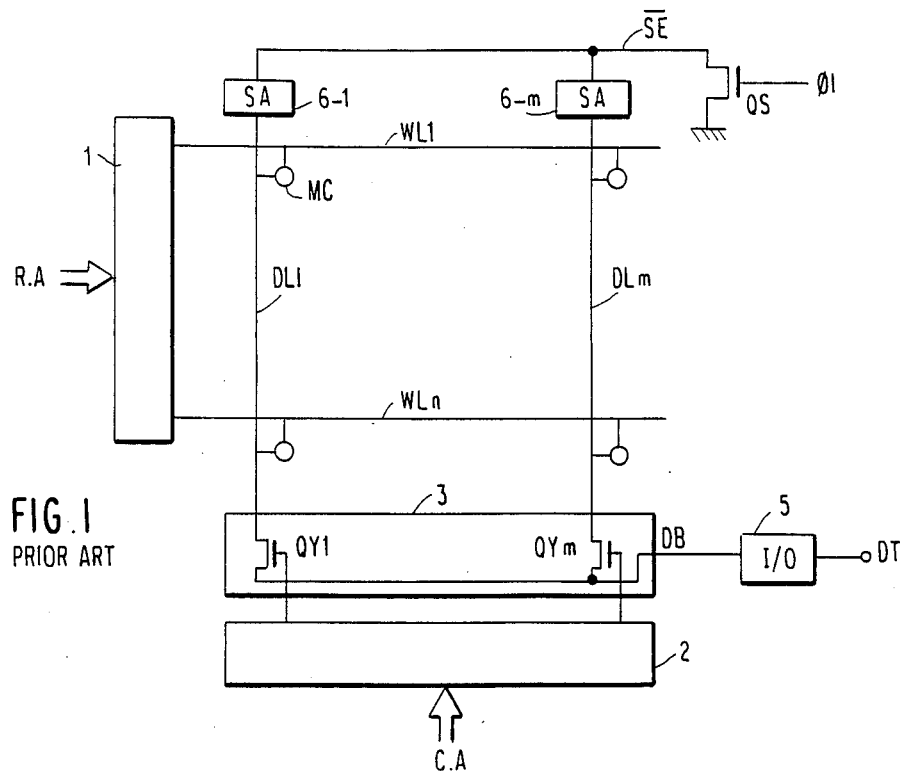
FIG. 1 is a schematic block diagram of a memory circuit according to a prior art.

Referring to FIG. 1, a dynamic memory circuit according to a prior art will be explained.

A plurality of dynamic type memory cells MC are arranged at the intersections of word lines $WL_1$–$WL_n$ in rows and digit lines in column in to form a memory matrix. A row decoder 1 receives row address signals R.A. and selects one of the word lines. After one of the word lines, e.g. $WL_1$ is selected, the memory cells coupled 0 to the selected word line $WL_1$ cause small potential change in the digit lines according to stored contents of the Then, a control signal $\phi_1$ is energized to a high level to render a transistor QS conductive. As a result, a sense amplifier activation signal line $\overline{SE}$ is gradually discharged to the ground potential and the sense amplifiers 6-1 to 6-m discharge charges on the digit lines selectively to amplify the potentials of the digit lines. The amplified potentials on the digit lines are simultaneously write-back to the selected memory cells so that refresh of the selected memory cells is achieved.

While a column decoder 2 selectively turns conductive one of column select transistors $QY_1$–$QY_m$ in a column election circuit 3 according to content of column address signals so that the signal on the selected digit line is transmitted to a data bus line DB via the conductive transfer transistor and further outputted to a data terminal DT via an input/output circuit 5.

Figure 3:
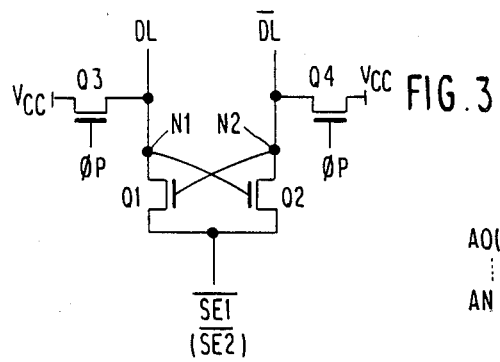
FIG. 3 is a schematic circuit diagram of a sense amplifier.
Figure 4:
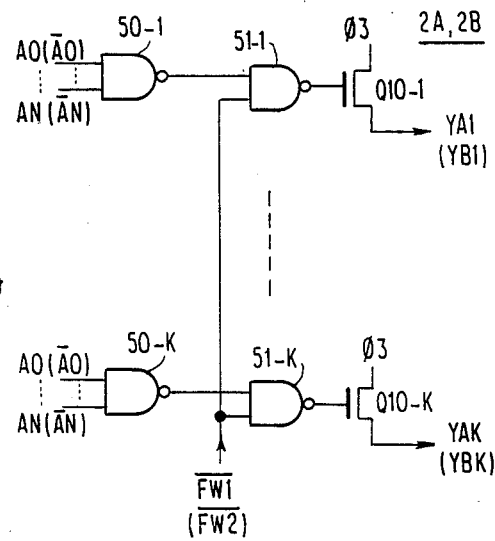
FIG. 4 is a schematic block diagram showing a column decoder.
Figure 2:
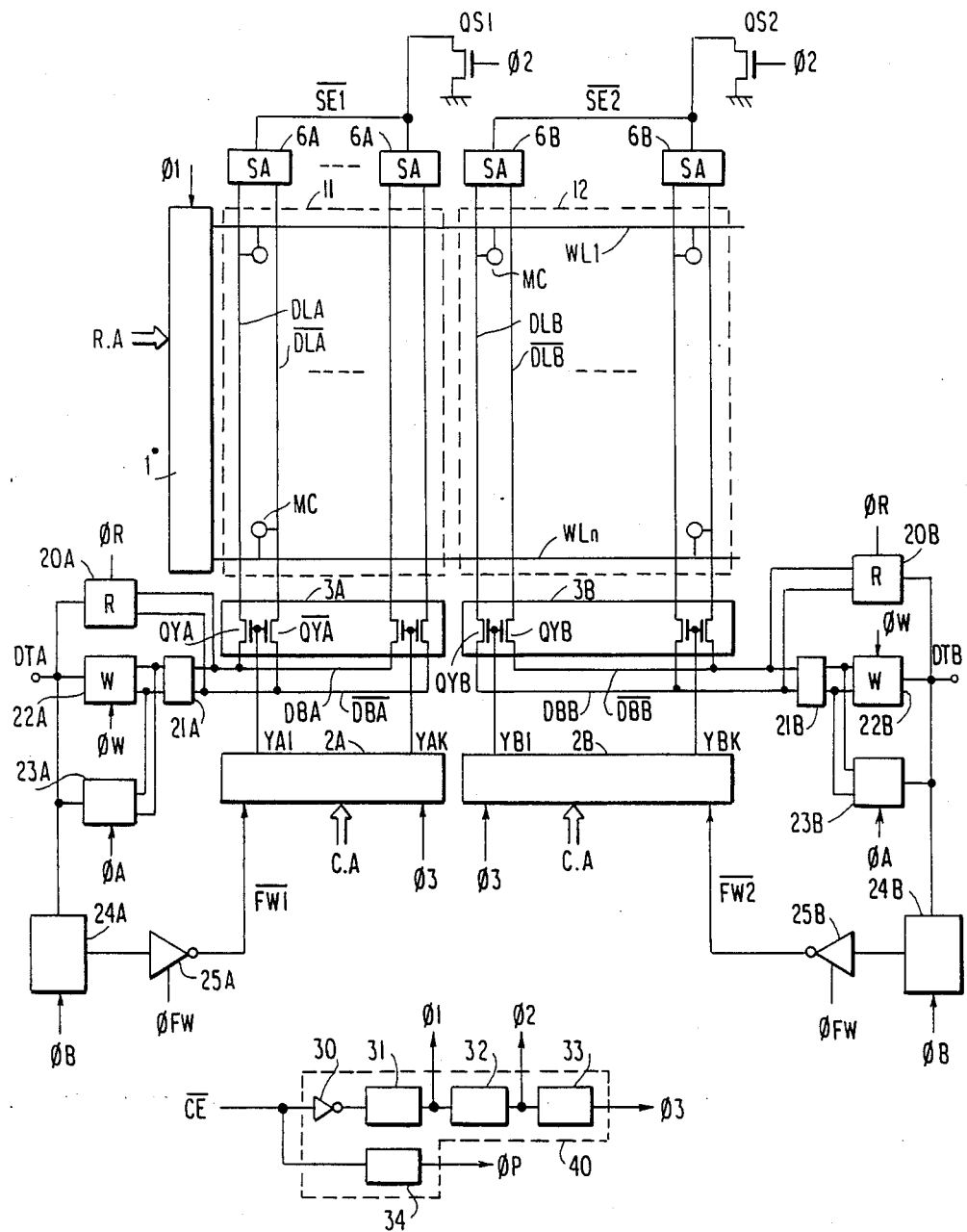
FIG. 2 is a schematic block diagram of a memory circuit according to an embodiment of the present invention.

Referring to FIGS. 2 to 4, a dynamic memory circuit according to one embodiment of the invention will be explained below.

A major circuit arrangement of the embodiment is shown in FIG. 2. As shown in FIG. 2, a plurality of dynamic memory cells MC are arranged into two memory arrays 11 and 12. The arrays 11 and 12 share the same word lines $WL_1$-$WL_n$ in rows. On the other hand, K pairs of digit lines DLA, $\overline{DLA}$ and K pairs of digit lines DLB and $\overline{DLB}$ are separately provided in the arrays 11 and 12, respectively. The row decoder 1 selects one of the word lines according to the row address signals R.A in response to a timing signal $\phi_1$. A column selection circuit 3A includes K pairs of transfer gate transistors QYA, $\overline{QYA}$ coupled between K pairs of digit lines DLA, $\overline{DLA}$ and a pair of bus lines DBA, $\overline{DBA}$. A column selection circuit 3B includes K pairs of transfer gate transistors QYB, $\overline{QYB}$ coupled between the K pairs of digit lines DLB, $\overline{DLB}$ and a pair of bus lines DBB, $\overline{DBB}$. A column decoder 2A energizes or activates one of outputs YA1-YAK in accordance with contents of row address signals C·A in response to a timing signal $\phi_3$ thereby to connect the pair of bus lines DBA, $\overline{DBA}$ to one pair of digit lines DLA, $\overline{DLA}$ via the conducting pair of transistors QYA, $\overline{QYA}$ when a flash write control signal $\overline{FW_1}$ at a high level. A column decoder 2B also selects one pair of transfer gate transistors QYB, $\overline{QYB}$ for electrical connection of the pair of bus lines DBB, $\overline{DBB}$ to the selected pair of digit lines DLB, $\overline{DLB}$ in accordance with the contents of column address signals C.A in response to $\phi_3$ when a flash write control signal $\overline{FW_2}$ is at a high level. When the flash write control signal $FW_1$ and $FW_2$ are at a low level, the column decoders 2A and 2B activate all the outputs YA1-YAK and all the outputs YB1-YBK simultaneously irrespective of the column address signals, respectively, so that the pair of bus lines DBA, $\overline{DBA}$ and the pair of bus lines DBB, $\overline{DBB}$ are electrically connected to all the K pairs of digit lines DLA, $\overline{DLA}$ and all the K pairs of digit lines DLB, $\overline{DLB}$, respectively.

A read buffer 20A, a write register 22A, and a write driver 21 perform a read operation and a write operation for the array 11. Namely, the read buffer 20A generates an output signal at an input/output terminal DTA in accordance with the states of the bus lines DBA, $\overline{DBA}$ in response to a read control signal $\phi_R$. The write register 22A holds the signal at DTA as a write data signal in response to a write control signal $\phi_W$ and determines the input levels of the w.iter driver 21A. Similarly, 25 a read buffer 20B, a write register 22B and a write driver 21B perform a read operation and a write operation with respect to the array 12. Color registers 23A and 23B have inputs coupled to the terminals DTA and DTB and outputs coupled to the inputs of the write drivers 21A and 21B, respectively and latch the levels of DTA and DTB in response to a control signal $\phi_A$, respectively. Flash write control registers 24A and 24B have inputs coupled to DTA and DTB and latch the levels of DTA and DTB in response to a control signal $\phi_B$, respectively.

Inverters 25A and 25B receive the outputs of the control registers 24A. and 24B and produces the control signals $\overline{FW_1}$ and $\overline{FW_2}$, respectively in response to a flash write timing signal $\phi_{FW}$, respectively.

A sense amplifier activation gate or transistor $QS_1$ is coupled between a sense amplifier activation line $\overline{SE1}$ coupled to the sense amplifiers 6A for the array and the ground potential and operatively changes the potential of the line $\overline{SE1}$ to the ground in response to a control signal $\phi_2$ applied to the gate thereof, thereby to enable the sense amplifiers 6A. A transistor $QS_2$ is coupled between a sense amplifier activation line coupled to the sense amplifiers 6B for the array 12 and operatively discharges the line $\overline{SE2}$ in response to $\phi_3$ thereby to enable the sense amplifiers 6B. Namely, the transistors $QS_1$ and $QS_2$ and the activation lines $\overline{SE1}$ and $\overline{SE2}$ serve as independent sense amplifier activating means for the arrays 11 and 12, respectively.

A timing signal generator 40 includes an inverter 30 and delay stages 31 to 34 and generates a precharge signal $\phi_P$ and the timing signals $\phi_1$, $\phi_2$ and $\phi_3$ in response to a chip enable signal CE in a known way.

An example of the sense amplifiers 6A and 6B is shown in FIG. 3. In FIG. 3, transistors $Q_1$ and $Q_2$ have gates and drains cross-coupled at a pair of nodes $N_1$ and $N_2$ and sources commonly connected to the activated line $\overline{SE1}$ or $\overline{SE2}$ to form a flip-flop and a pair of precharge transistors $Q_3$ and $Q_3$ controlled by $\phi_P$. The nodes $N_1$ and $N_2$ are connected to a pair of digit lines DL and $\overline{DL}$.

An example of the column decoders 2A and 2B is shown in FIG. 4. First NAND gates 50-1 to 50-K receive column address signals $A_O$ ($\overline{A_O}$-$A_N$ ($\overline{A_N}$) in their predetermined combinations and one first NAND gate whose inputs are all "1" level generates "0" (low) level output while other first NAND gates generate "1" (high) output signals. Second NAND gates 51-1 to 51-K receive the outputs of the first NAND gates 50-1 to 50-K and the control signal $\overline{FW1}$ ($\overline{FW2}$) in common and one second NAND gate generates the "1" level output signal and other second NAND gates produce the "0" output signal when is at the high level. Source-follower transistors to $Q_{10-1}$ to $Q_{10-K}$ receive the outputs of the second NAND gates 51-1 to 51-K at their gates and selectively transmit the signal $\phi_3$ to the outputs YA1 (YB1) to YAK (YBK). When $\overline{FW1}$ ($\overline{FW2}$) is at the "0" (low) level, all the outputs of the second NAND gates generate the "1" level outputs so that all the outputs YA1 - YAK are activated via $Q_{10-1}$ to $Q_{10-K}$ in response to $\phi_3$.

Figure 5:
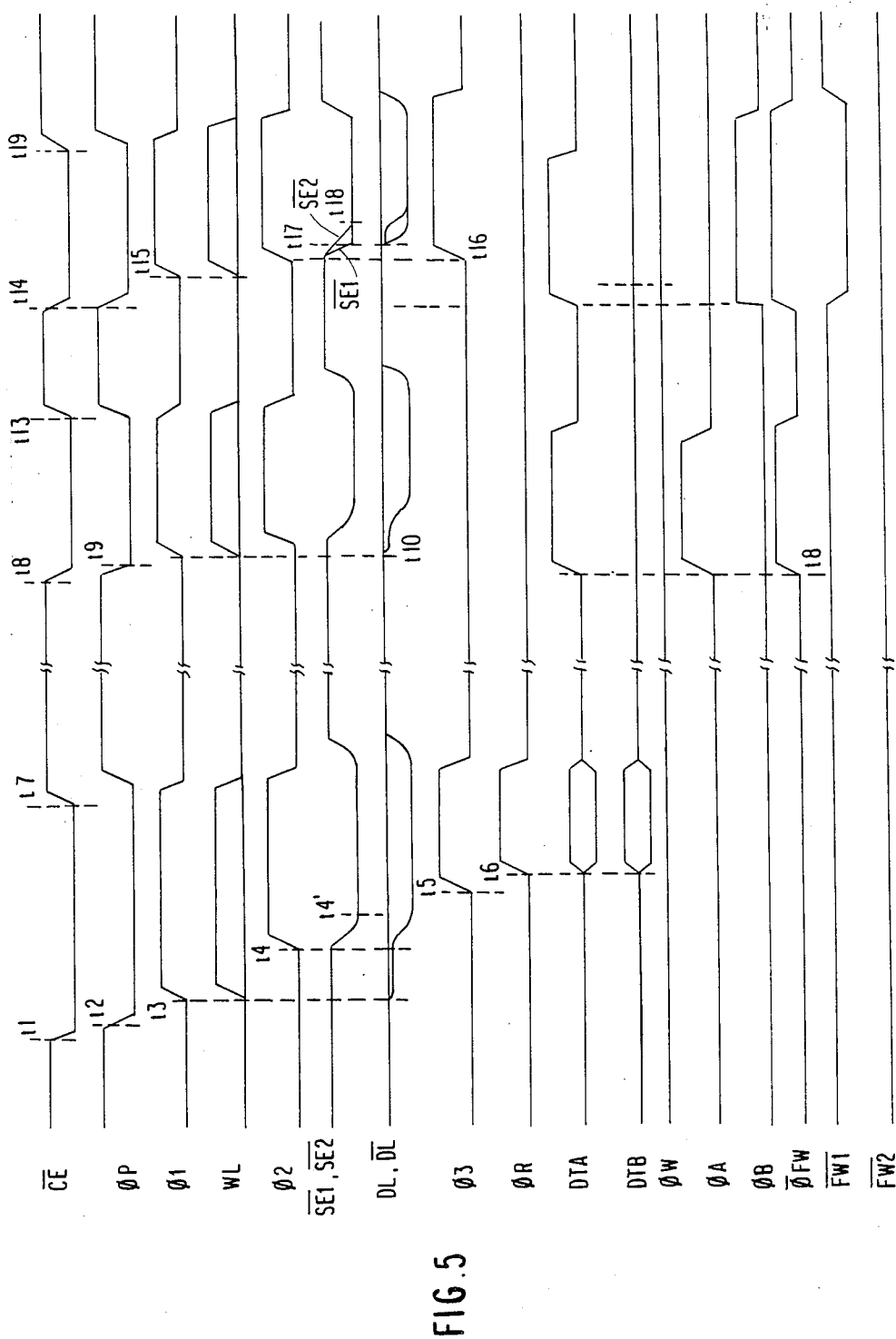
FIG. 5 is a timing diagram showing operations of the memory in FIG. 2.

Next, with reference to FIG. 5, operations of the First, a normal read operation will be explained through a time frame $t_1$-$t_7$.

At a time point $t_1$, $\overline{CE}$ changes from the high, inactive level to the low active level and the memory circuit enters into an active period. In response to this, the precharge signal $\phi_p$ falls in level at a time point $t_2$ and thereafter the timing signal $\phi_1$ rises in potential so that one of the word lines WL is selected and small signals from the memory cells MC coupled to the selected word line appear in the respective pairs of digit lines in the arrays 11 and 12. Then, at a time point $t_4$, the timing signal $\phi_2$ rises in potential and the transistors $QS_1$ and $QS_2$ are rendered conductive. As a result, the potentials of the activation lines $\overline{SE1}$ and $\overline{SE2}$, which have been precharged to a predetermined precharge potential in response to $\phi_p$, starts to fall gradually till $t_4'$ so that the sense amplifiers 6A and 6B are enabled to amplify the potential difference in the respective digit line pairs. Then, at a time point $t_5$, the signal $\phi_3$ rises in potential and the output states of the column decoders 2A and 2B are determined. Thus, the signal at the selected digit line pair in the array 11 and the signal at the selected digit line pair in the array 12 are transmitted to the pair of bus lines DBA, $\overline{DBA}$ and the pair of bus lines DBB, $\overline{DBB}$, respectively. At a time point $t_6$, the signal $\phi_R$ is raised in potential and the buffers 20A and 20B are enabled so that the signals on the bus line pairs DBA, $\overline{DBA}$; DBB, $\overline{DBB}$ are outputted to DTA and DTB, respectively.

Then, at a time point $t_7$, $\overline{CE}$ rises to the high level to terminate the active period and the precharge signal $\phi_P$ is raised.

Next, a flash write mode operation in which a flash write is made on the array 11 so that the same data is written into K memory cells coupled to the selected word line and a refresh operation is made on the array 12, as follows. First, the data to be written to the array 11 is set in the color register 23A via DTA in response to $\phi_A$ and a flash write determination signal for determining whether the flash write is conducted or not, is stored in the control register 24A via DTA in response to $\phi_B$. When the high ("1") level is stored in the register 24A the low level of $\overline{FW1}$ is produced from the inverter 25A in response to $\phi_{FW}$ so that all the outputs YA-1-YAK of the column decoder 2A is selected and the content of the register 23A is transmitted to all the selected memory cells via the driver 21A, the transfer gate transistors QYA, $\overline{QYA}$ and the bit line pairs DLA, $\overline{DLA}$.

The detailed explanation is made below.

When $\overline{CE}$ becomes low in level at $t_8$, $\phi_{FW}$ and $\phi_A$ rise in potential so that a set cycle of the color registers 23A and 23B in the flash write cycle is initiated. In this case, DTA is at the high level and DTB is at the low level, and hence "1" and "0" are stored in the color registers 23A and 23B, respectively. While $\phi_P$ falls at $t_9$ and $\phi_1$ rises at $t_{10}$ and thereafter $\phi_2$ rises. Thus, one of the word lines in the arrays 11 and 12 is selected and the memory cells coupled to the selected word line are refreshed by the sense amplifiers 6A and 6B which are enabled by $\overline{SE1}$ and $\overline{SE2}$ falling in potential in response to $\phi_2$. Thereafter, $\overline{CE}$ is once reset to the high level at $t_{13}$ and the memory is reset. Then, $\overline{CE}$ falls again at $t_{14}$ and $\phi_{FW}$ and $\phi_B$ rise to start a flash write execution cycle. In this instance, DTA and DTB are at "1" and "0" which means that the array 11 is to be subjected to the flash write operation and the array 12 is subjected not to the flash write operation but to a refresh operation. The levels of DTA and DTB are latched in the registers 24A and 24B, respectively. Thus, $\overline{FW1}$ is changed to the low level while $\overline{FW2}$ remains at the high level. Accordingly, all the outputs of the column decoder 2A are to be at the selected ("1") level and the pair of bus lines DBA, $\overline{DBA}$ are electrically connected all the pairs of digit lines DLA, $\overline{DLA}$ in the array at $t_{16}$, irrespective of contents of the column address signals C.A.

While, the column decoder 2B activates only one of its outputs or none of them because of the high level of $\overline{FW2}$ and any data from the array 12 is not outputted to DTB because $\phi_R$ and $\phi_W$ are at the inactive level.

Then, after the fall of $\phi_P$, $\phi_1$ rises at $t_{15}$ so that one of the word lines WL is selected. At a time point $t_{16}$, $\phi_3$ rises and all the outputs of the column decoder 2A are activated and the data stored in the register 23A is applied to al the pair of digit lines DLA, $\overline{DLA}$ via the applied to all the pair of digit driver 21A and the selection circuit 3A. In this instance, the transistors $QS_1$ and $QS_2$ are rendered conductive in response to $\phi_2$ and the activation lines $\overline{SE1}$ and $\overline{SE2}$ are to be discharged by the transistors $QS_1$ and $QS_2$. It should be noted that the states of the sense amplifiers 6A are rapidly determined by the driver 21A and the activation is rapidly discharged by $t_{17}$. While, the activation line $\overline{SE2}$ for the array 12 is gradually discharged because the potential differences in the respective pairs of digit lines DLB, $\overline{DLB}$ in the array 12 are small and the sense amplifiers 6B gradually amplify the above potential differences by $t_{18}$, which is after $t_{17}$.

Accordingly, the activation line $\overline{SE1}$ for the array 11 performing the flash write operation and the activation line $\overline{SE2}$ for the array 12 performing the refresh operation are separated and driven by the separate transistors $QS_1$ and $QS_2$, respectively. Therefore, the sense amplifiers 6A and 6B can operate independently for the different purposes.

I claim:

1. A dynamic memory circuit comprising first and second memory arrays, each of said first and second arrays including a plurality of word lines arranged in rows, a plurality of digit lines arranged in columns normal to the direction of said rows of word lines, and a plurality of memory cells arranged in a matrix of rows and columns and coupled to said word lines and said digit lines, a row selection circuit coupled to the word lines of said first and second memory arrays for operatively selecting one of the word lines of said first memory array and one of the word lines of said memory array simultaneously in response to row address information, a first data line, a plurality of first transfer gates connected between said first data line and the digit lines of said first memory array, a second data line, a plurality of second transfer gates connected between said second data line and the digit lines of said second memory array, a first data input circuit coupled to said first data line and operatively supplying a first input data signal thereto, a second data input circuit coupled to said second data line and operatively supplying a second input data thereto, a plurality of first sense amplifiers connected to the digit lines of said first memory array for operatively amplifying levels at the digit lines of said first memory array, a plurality of second sense amplifiers connected to the digit lines of said second memory array for operatively amplifying levels at the digit lines of said second memory array, first means for receiving a first control signal taking one of first and second levels, second means for receiving a second control signal taking one of the first and second levels, a first column decoder circuit coupled to said first transfer gates and said first means, said first column decoder enabling one of said first transfer gates when said first control signal is at said first level and enabling all of said first transfer gates when said first control signal is at said second level, a second column decoder circuit coupled to said second transfer gates and said second means, said second column decoder enabling one of said second transfer gates when said second control signal is at said first level and enabling all of said second transfer gates when said second control signal is at said second level, a first sense control circuit coupled to said first sense amplifiers for enabling said first sense amplifiers simultaneously in response to a sense enable signal, and a second sense control circuit coupled to said second sense amplifiers for enabling said second sense amplifiers in response to said sense enable signal.

2. The memory circuit according to claim 1, in which each of said first and second sense amplifiers includes a first field effect transistor having a source-drain path connected between first and second nodes and a gate connected to a third node, a second field effect transistor having a source-drain path connected between said third and second nodes and a gate connected to said first node, and means for connecting said first nodes to the corresponding digit line.

3. The memory circuit according to claim 2, in which said first sense control circuit includes a first control line connected to the second nodes of said first sense discharge transistor connected between said first control line and reference voltage source, and said second control circuit includes a second control line connected to the second nodes of said second sense amplifiers in common, and a second discharge transistor connected between said second control line and said reference voltage source.

4. The memory circuit according to claim 1, in which each of said first and second column decoder circuits includes a plurality of decode units, each of said decode units having a first NAND gate receiving column address signals, a second NAND gate receiving an output signal from said first NAND gate and the corresponding one of said first and second control signals and a drive field effect transistor having a gate receiving an output signal of said second control signal.

* * * * *

UNITED STATES PATENT AND TRADEMARK OFFICE
CERTIFICATE OF CORRECTION

PATENT NO. : 4,879,692

DATED : November 7, 1989

INVENTOR(S) : Tokushige

It is certified that error appears in the above-identified patent and that said Letters Patent is hereby corrected as shown below:

Column 1, line 19, delete "ad" and insert --and--;

Column 2, line 49, after "the" insert --selected memory cells--;

Column 3, line 30, delete "$FW_1$ and $FW_2$" and insert --$\overline{FW_1}$ and $\overline{FW_2}$--;

Column 3, line 46, delete "w.iter" and insert --write--;

Column 3, line 47, delete "25".

Column 4, line 1, after "line" insert --$\overline{SE2}$--;

Column 4, line 11, delete "CE" and insert --$\overline{CE}$--;

Column 4, line 31, after "when" insert --$\overline{FW1}$ ($\overline{FW2}$)--;

Column 4, line 40, after "the" insert --embodiment will be explained--;

Column 5, line 8, after "12," insert --is explained. The above mode of operation is conducted--;

Column 5, line 46, after "connected" insert --to--;

Column 5, line 57, delete "al" and insert --all--;

Column 5, lines 57 and 58, after "via the" delete "applied to all the pair of digit";

UNITED STATES PATENT AND TRADEMARK OFFICE
CERTIFICATE OF CORRECTION

PATENT NO. : 4,879,692

DATED : November 7, 1989

INVENTOR(S) : Tokushige

It is certified that error appears in the above-identified patent and that said Letters Patent is hereby corrected as shown below:

Column 5, line 64, after "activation" insert --line $\overline{\overline{SEI}}$

Signed and Sealed this

Eighth Day of January, 1991

Attest:

HARRY F. MANBECK, JR.

*Attesting Officer*  *Commissioner of Patents and Trademarks*